(12) United States Patent
Imamura

(10) Patent No.: US 9,252,737 B2
(45) Date of Patent: Feb. 2, 2016

(54) FILTER

(71) Applicant: Murata Manufacturing Co., Ltd., Nagaokakyo-shi, Kyoto-fu (JP)

(72) Inventor: Mitsutoshi Imamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 174 days.

(21) Appl. No.: 13/950,606

(22) Filed: Jul. 25, 2013

(65) Prior Publication Data
US 2014/0062616 A1 Mar. 6, 2014

(30) Foreign Application Priority Data

Sep. 5, 2012 (JP) ................................. 2012-195398

(51) Int. Cl.
| | |
|---|---|
| *H03H 7/09* | (2006.01) |
| *H03H 7/12* | (2006.01) |
| *H03H 7/01* | (2006.01) |
| *H03H 1/00* | (2006.01) |

(52) U.S. Cl.
CPC ............... *H03H 7/12* (2013.01); *H03H 7/0115* (2013.01); *H03H 7/09* (2013.01); *H03H 7/1708* (2013.01); *H03H 7/1783* (2013.01); *H03H 2001/0085* (2013.01)

(58) Field of Classification Search
CPC .................... H03H 2001/0085; H03H 7/0115; H03H 7/09; H03H 7/1783
USPC ................................................. 333/185, 175
See application file for complete search history.

(56) References Cited

U.S. PATENT DOCUMENTS

| | | | |
|---|---|---|---|
| 3,718,874 A | * | 2/1973 | Cooper, Jr. .................... 333/204 |
| 6,222,427 B1 | | 4/2001 | Kato et al. |
| 7,671,706 B2 | * | 3/2010 | Taniguchi ..................... 333/203 |

(Continued)

FOREIGN PATENT DOCUMENTS

| | | |
|---|---|---|
| JP | 9-35936 A | 2/1997 |
| WO | 2007/119356 A1 | 10/2007 |
| WO | 2012/111370 A1 | 8/2012 |

OTHER PUBLICATIONS

Tsai, C. et al., "Analysis and Design of Single-to-Balanced Combline Bandpass Filters with Two Independently Controllable Transmission Zeros in LTCC Technology", IEEE Transactions on Microwave Theory and Techniques, vol. 58, No. 11, Nov. 2010, pp. 2878-2887.

(Continued)

*Primary Examiner* — Benny Lee
*Assistant Examiner* — Rakesh Patel
(74) *Attorney, Agent, or Firm* — Keating & Bennett, LLP

(57) ABSTRACT

In a filter, a plurality of coils include a plurality of line conductor layers that are each provided on an insulator layer, a plurality of via hole conductors that extend from one end of the line conductor layers in the y-axis direction to the negative direction side of the z-axis direction, and are electrically connected to a plurality of capacitor conductor layers, and a plurality of via hole conductors that extend from the other end of the line conductor layers in the y-axis direction to the negative direction side of the z-axis direction, and are electrically connected to a ground conductor layer. The distance between the via hole conductor layers connected to the ground conductor layer differs from the distance between the via hole conductor layers connected to the capacitor conductor layers.

11 Claims, 11 Drawing Sheets

(56) References Cited

U.S. PATENT DOCUMENTS

2010/0283557 A1* 11/2010 Taniguchi ............... 333/204
2012/0319800 A1   12/2012 Sasaki et al.
2013/0194056 A1*  8/2013 Masuda ................. 333/185

OTHER PUBLICATIONS

Tang, C. et al., "Realization of Transmission Zeros in Combline Filters Using an Auxiliary Inductively Coupled Ground Plane", IEEE Transactions on Microwave Theory and Techniques, vol. 51, No. 10, Oct. 2003, pp. 2112-2118.

* cited by examiner

FILTER

BACKGROUND OF THE INVENTION

1. Field of the Invention

The present invention relates to a filter, and more specifically to a filter including a plurality of LC parallel resonators.

2. Description of the Related Art

As an invention related to a filter according to related art, for example, there is a multilayer band pass filter described in International Publication No. 2007/119356. FIG. 19 is an exploded perspective view of a multilayer band pass filter 500 described in International Publication No. 2007/119356.

The multilayer band pass filter 500 includes a laminate 502, and LC parallel resonators 504, 506, 508, 510, and 512. The laminate 502 is formed by laminating a plurality of insulator layers together. Each of the LC parallel resonators 504, 506, 508, 510, and 512 includes conductor layers and via hole conductors, and is in the form of a loop when seen in plan view from a direction substantially orthogonal to the laminating direction. The loop planes of the LC parallel resonators 504, 506, 508, 510, and 512 overlap one another.

In the multilayer band pass filter 500, the loop planes of the LC parallel resonators 504, 506, 508, 510, and 512 are slightly shifted from one another. Consequently, the degree of coupling between the LC parallel resonators 504, 506, 508, 510, and 512 is lowered, thereby making it possible to narrow the pass band of the multilayer band pass filter 500. As a result, the multilayer band pass filter 500 having a desired transmission characteristic is obtained.

Filters that can provide a desired transmission characteristic as described above are being desired.

SUMMARY OF THE INVENTION

Accordingly, preferred embodiments of the present invention provide a filter that makes it possible to easily obtain a desired transmission characteristic.

According to a preferred embodiment of the present invention, a filter includes a laminate that includes a plurality of insulator layers that are laminated together, and a plurality of LC parallel resonators that are arranged along a first direction orthogonal or substantially orthogonal to a laminating direction in the laminate, the LC parallel resonators each including a coil and a capacitor. The LC parallel resonators that are adjacent to each other in the first direction are electromagnetically coupled to each other. Each of the capacitors includes a capacitor conductor layer, and a ground conductor layer that is opposite to the capacitor conductor layer via each of the insulator layers. Each of the coils includes a line conductor layer that is provided on each of the insulator layers, a first via hole conductor that extends from one end of the line conductor layer in a second direction to one side of the laminating direction, the second direction being orthogonal or substantially orthogonal to a laminating direction and the first direction, the first via hole conductor being electrically connected to the capacitor conductor layer, and a second via hole conductor that extends from another end of the line conductor layer in the second direction to the one side of the laminating direction, the second via hole conductor being electrically connected to the ground conductor layer. A first distance between the first via hole conductors that are adjacent to each other in the first direction differs from a second distance between the second via hole conductors that are adjacent to each other in the first direction.

According to various preferred embodiments of the present invention, a desired transmission characteristic can be easily obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a filter according to a preferred embodiment of the present invention will be described.

Figure 1:
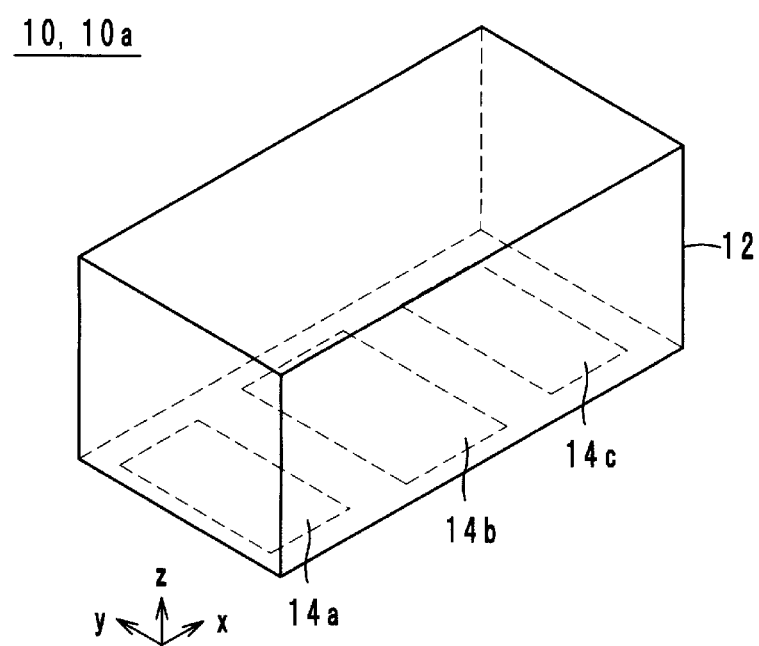
FIG. 1 is a perspective view of the outward appearance of a filter according to a preferred embodiment of the present invention.
Figure 2:
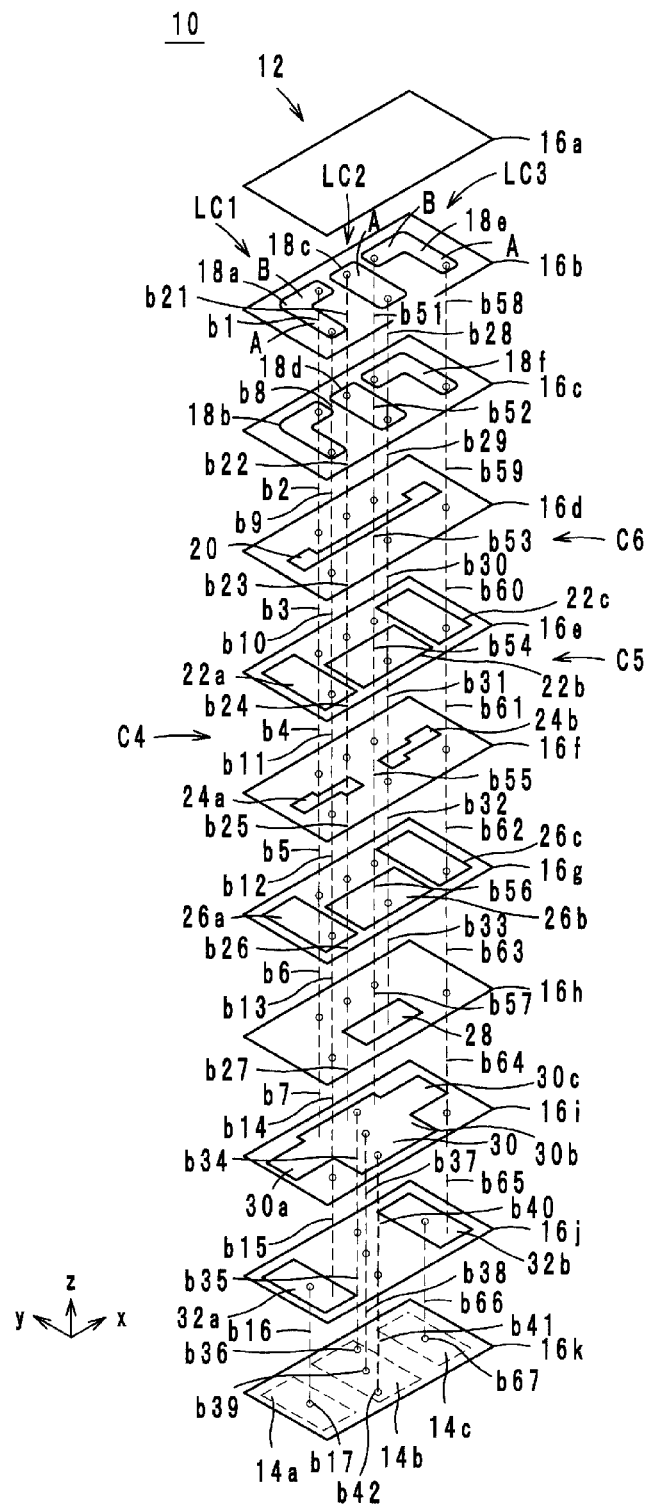
FIG. 2 is an exploded perspective view of a laminate of the filter.
Figure 3:
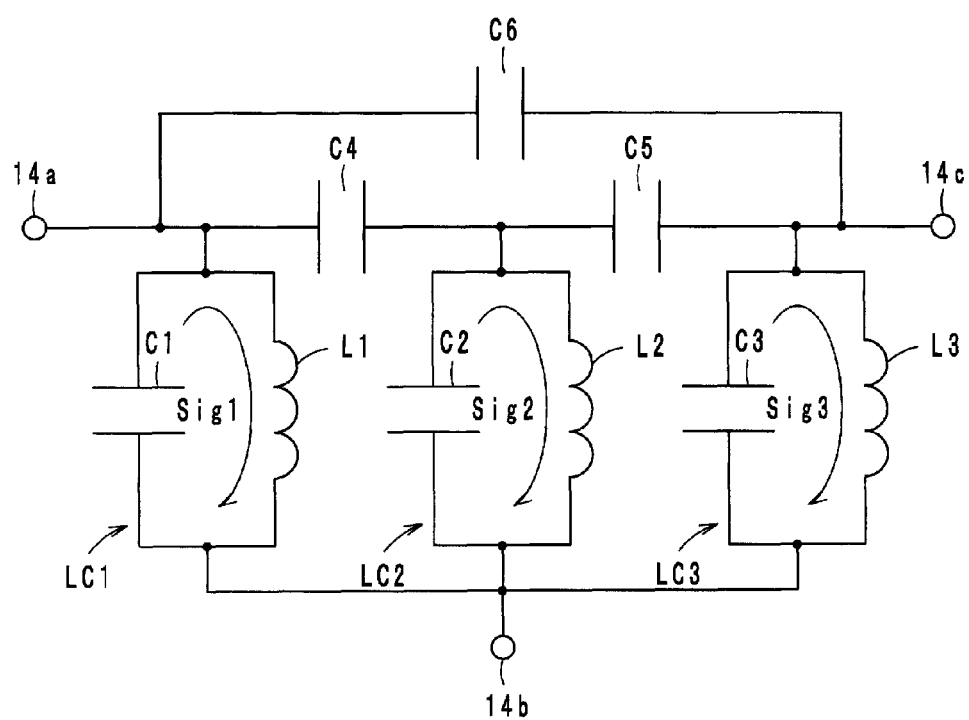
FIG. 3 is an equivalent circuit diagram of the filter.

Hereinafter, the configuration of a filter according to a preferred embodiment of the present invention will be described with reference to the drawings. FIG. 1 is a perspective view of the outward appearance of a filter 10 according to the preferred embodiment of the present invention. FIG. 2 is an exploded perspective view of a laminate 12 of the filter 10. FIG. 3 is an equivalent circuit diagram of the filter 10. In FIGS. 1 and 2, the z-axis direction represents the laminating direction of insulator layers 16. The x-axis direction represents a direction along the long side of the filter 10, and the y-axis direction represents a direction along the short side of the filter 10. The x-axis direction, the y-axis direction, and the z-axis direction are orthogonal or substantially orthogonal to one another.

As illustrated in FIGS. 1 and 2, the filter 10 includes the laminate 12, outer electrodes 14 (14a to 14c), LC parallel resonators LC1 to LC3, capacitors C4 to C6, and via hole conductors b16, b17, b34 to b42, b66, and b67.

As illustrated in FIG. 2, the laminate 12 is formed preferably by laminating insulator layers 16a to 16k each made of a ceramic dielectric, and has a rectangular or substantially rectangular parallelepiped shape. In addition, the laminate 12 includes the LC parallel resonators LC1 to LC3 and the capacitors C4 to C6.

As illustrated in FIG. 2, each of the insulator layers 16a to 16k has a rectangular or substantially rectangular shape, and is preferably formed by, for example, a ceramic dielectric. The insulator layers 16a to 16k are laminated so as to be arranged in this order from the positive direction side of the z-axis direction to the negative direction side. Hereinafter, the surface of each of the insulator layers 16 on the positive direction side of the z-axis direction is referred to as front surface, and the surface of each of the insulator layers 16 on the negative direction side of the z-axis direction is referred to as a back surface.

The LC parallel resonators LC1 to LC3 are arranged along the x-axis direction. In this preferred embodiment, as seen in plan view from the z-axis direction, the LC parallel resonators LC1 to LC3 are arranged in this order from the negative direction side to the positive direction side of the x-axis direction. The LC parallel resonators LC1 to LC3 that are adjacent to each other in the y-axis direction are electromagnetically coupled to each other, so as to define a band pass filter.

As illustrated in FIG. 3, the LC parallel resonator LC1 includes a coil L1 and a capacitor C1. More specifically, the LC parallel resonator LC1 includes via hole conductors b1 to b15, line conductor layers 18a and 18b, capacitor conductor layers 26a and 32a, and a ground conductor layer 30, and is in the form of a loop.

The capacitor C1 includes the capacitor conductor layers 26a and 32a, and the ground conductor layer 30. The ground conductor layer 30 is a cross-shaped or substantially cross-shaped conductor layer, and includes an end portion 30a, a central portion 30b, and an end portion 30c. The central portion 30b is a rectangular or substantially rectangular conductor layer provided at the center of the front surface of the insulator layer 16i. The end portion 30a is a rectangular or substantially rectangular conductor that projects from an edge on the negative direction side of the x-axis direction of the central portion 30b toward the negative direction side of the x-axis direction. The end portion 30c is a rectangular or substantially rectangular conductor that projects from an edge on the positive direction side of the x-axis direction of the central portion 30b toward the positive direction side of the x-axis direction.

The capacitor conductor layer 26a is a conductor layer that is opposite to the end portion 30a of the ground conductor layer 30 via the insulator layers 16g and 16h. The capacitor conductor layer 26a is provided on the front surface of the insulator layer 16g. Consequently, an electrostatic capacitance is generated between the capacitor conductor layer 26a and the ground conductor layer 30. The capacitor conductor layer 26a has a rectangular or substantially rectangular shape whose length is along the y-axis direction. The capacitor conductor layer 26a is provided on the negative direction side of the x-axis direction with respect to the intersection of the diagonals of the insulator layer 16g.

The capacitor conductor layer 32a is a conductor layer that is opposite to the end portion 30a of the ground conductor layer 30 via the insulator layer 16i. The capacitor conductor layer 32a is provided on the front surface of the insulator layer 16j. Consequently, an electrostatic capacitance is generated between the capacitor conductor layer 32a and the ground conductor layer 30. The capacitor conductor layer 32a has a rectangular or substantially rectangular shape whose length is along the y-axis direction. The capacitor conductor layer 32a is provided on the negative direction side of the x-axis direction with respect to the intersection of the diagonals of the insulator layer 16j. As the electrostatic capacitance between the capacitor conductor layer 26a and the ground conductor layer 30, and the electrostatic capacitance between the capacitor conductor layer 32a and the ground conductor layer 30 are connected substantially in parallel, the capacitor C1 is provided.

The coil L1 includes the via hole conductors b1 to b15 and the line conductor layers 18a and 18b. The line conductor layer 18a is provided on the front surface of the insulator layer 16b, and is a linear or substantially linear conductor having an L shape or a substantially L shape. More specifically, the line conductor layer 18a includes a parallel portion A and a bent portion B. The parallel portion A extends in the y-axis direction. The bent portion B extends from an end portion on the positive direction side of the y-axis direction of the parallel portion A to the positive direction side of the x-axis direction. The line conductor layer 18a configured as described above is provided on the negative direction side of the x-axis direction with respect to the intersection of the diagonals of the insulator layer 16b.

The line conductor layer 18b is provided on the front surface of the insulator layer 16c, and is a linear or substantially linear conductor having an L shape or a substantially L shape. More specifically, the line conductor layer 18b includes a parallel portion A and a bent portion B. The parallel portion A extends in the y-axis direction. The bent portion B extends from an end portion on the positive direction side of the y-axis direction of the parallel portion A to the positive direction side of the x-axis direction. The line conductor layer 18b configured as described above is provided on the negative direction side of the x-axis direction with respect to the intersection of the diagonals of the insulator layer 16c.

The via hole conductors b1 to b7 penetrate the insulator layers 16b to 16h, respectively, in the z-axis direction. An end portion on the positive direction side of the z-axis direction of the via hole conductor b1 is connected to an end portion on the positive direction side of the x-axis direction of the bent portion B of the line conductor layer 18a. An end portion on the positive direction side of the z-axis direction of the via hole conductor b2 is connected to an end portion on the positive direction side of the x-axis direction of the bent portion B of the line conductor layer 18b. An end portion on the negative direction side of the z-axis direction of the via hole conductor b7 is connected to the ground conductor layer 30. Consequently, the via hole conductors b1 to b7 define a single via hole conductor that extends from an end portion on the positive direction side of the y-axis direction of each of the line conductor layers 18a and 18b toward the negative direction side of the z-axis direction, and are connected to the ground conductor layer 30.

The via hole conductors b8 to b15 penetrate the insulator layers 16b to 16i, respectively, in the z-axis direction. The via hole conductors b8 to b15 are provided on the negative direction side of the y-axis direction with respect to the via hole conductors b1 to b7. An end portion on the positive direction side of the z-axis direction of the via hole conductor b8 is connected to an end portion on the negative direction side of the y-axis direction of the parallel portion A of the line conductor layer 18a. An end portion on the positive direction side of the z-axis direction of the via hole conductor b9 is connected to an end portion on the negative direction side of the y-axis direction of the parallel portion A of the line conductor layer 18b. An end portion on the negative direction side of the z-axis direction of the via hole conductor b12 is connected to the capacitor conductor layer 26a. In addition, an end portion on the negative direction side of the z-axis direction of the via hole conductor b15 is connected to the capacitor conductor layer 32a. Consequently, the via hole conductors b8 to b15 define a single via hole conductor that extends from an end portion on the negative direction side of the y-axis direction of each of the line conductor layers 18a and 18b toward the negative direction side of the z-axis direction, and are connected to the capacitor conductor layers 26a and 32a.

As described above, the coil L1 is in the form of a loop that runs from the connecting point of the via hole conductor b7 and the ground conductor layer 30 as one end, to the connecting point of the via hole conductor b15 and the capacitor conductor layer 32a as the other end, via the via hole conductors b1 to b7, the line conductor layers 18a and 18b, and the via hole conductors b8 to b15.

When seen in plan view from the z-axis direction, the LC parallel resonator LC1 configured as described above forms a loop plane that is bent in an L shape or a substantially L shape. The loop plane of the LC parallel resonator LC1 refers to an imaginary plane that is surrounded by the LC parallel resonator LC1.

As illustrated in FIG. 3, the LC parallel resonator LC2 includes a coil L2 and a capacitor C2. More specifically, the LC parallel resonator LC2 includes via hole conductors b21 to b33, line conductor layers 18c and 18d, capacitor conductor layers 26b and 28, and the ground conductor layer 30, and is in the form of a loop.

The capacitor C2 has the capacitor conductor layers 26b and 28, and the ground conductor layer 30. The ground conductor layer 30 is a cross-shaped or substantially cross-shaped conductor layer.

The capacitor conductor layer 26b is a conductor layer that is opposite to the central portion 30b of the ground conductor layer 30 via the insulator layers 16g and 16h. The capacitor conductor layer 26a is provided on the front surface of the insulator layer 16g. Consequently, an electrostatic capacitance is generated between the capacitor conductor layer 26b and the ground conductor layer 30. The capacitor conductor layer 26b has a rectangular or substantially rectangular shape whose length is along the x-axis direction. The capacitor conductor layer 26b is provided near the intersection of the diagonals of the insulator layer 16g.

The capacitor conductor layer 28 is a conductor layer that is opposite to the central portion 30b of the ground conductor layer 30 via the insulator layer 16h. The capacitor conductor layer 28 is provided on the front surface of the insulator layer 16h. Consequently, an electrostatic capacitance is generated between the capacitor conductor layer 28 and the ground conductor layer 30. The capacitor conductor layer 28 has a rectangular or substantially rectangular shape whose length is along the x-axis direction. The capacitor conductor layer 28 is provided on the negative direction side of the y-axis direction with respect to the intersection of the diagonals of the insulator layer 16h. As the electrostatic capacitance between the capacitor conductor layer 26b and the ground conductor layer 30, and the electrostatic capacitance between the capacitor conductor layer 28 and the ground conductor layer 30 are connected substantially in parallel, the capacitor C2 is provided.

The coil L2 includes the via hole conductors b21 to b33 and the line conductor layers 18c and 18d. The line conductor layer 18c is provided on the front surface of the insulator layer 16b, and is a linear or substantially linear conductor in the shape of a straight or substantially straight line extending in the y-axis direction. The line conductor layer 18c is defined by a parallel portion A. The line conductor layer 18c configured as described above is provided near the intersection of the diagonals of the insulator layer 16b.

The line conductor layer 18d is provided on the front surface of the insulator layer 16c, and is a linear or substantially linear conductor in the shape of a straight or substantially straight line extending in the y-axis direction. The line conductor layer 18d is defined by a parallel portion A. The line conductor layer 18d configured as described above is provided near the intersection of the diagonals of the insulator layer 16c.

The via hole conductors b21 to b27 penetrate the insulator layers 16b to 16h, respectively, in the z-axis direction. An end portion on the positive direction side of the z-axis direction of the via hole conductor b21 is connected to an end portion on the positive direction side of the y-axis direction of the line conductor layer 18c. An end portion on the positive direction side of the z-axis direction of the via hole conductor b2 is connected to an end portion on the positive direction side of the y-axis direction of the line conductor layer 18b. An end portion on the negative direction side of the z-axis direction of the via hole conductor b27 is connected to the ground conductor layer 30. Consequently, the via hole conductors b21 to b27 define a single via hole conductor that extends from an end portion on the positive direction side of the y-axis direction of each of the line conductor layers 18c and 18d toward the negative direction side of the z-axis direction, and are connected to the ground conductor layer 30.

The via hole conductors b28 to b33 penetrate the insulator layers 16b to 16g, respectively, in the z-axis direction. The via hole conductors b28 to b33 are provided on the negative direction side of the y-axis direction with respect to the via hole conductors b21 to b27. An end portion on the positive direction side of the z-axis direction of the via hole conductor b28 is connected to an end portion on the negative direction side of the y-axis direction of the line conductor layer 18c. An end portion on the positive direction side of the z-axis direction of the via hole conductor b29 is connected to an end portion on the negative direction side of the y-axis direction of the line conductor layer 18d. An end portion on the negative direction side of the z-axis direction of the via hole conductor b32 is connected to the capacitor conductor layer 26b. In addition, an end portion on the negative direction side of the z-axis direction of the via hole conductor b33 is connected to the capacitor conductor layer 28. Consequently, the via hole conductors b28 to b33 define a single via hole conductor that extends from an end portion on the negative direction side of the y-axis direction of each of the line conductor layers 18c and 18d toward the negative direction side of the z-axis direction, and are connected to the capacitor conductor layers 26b and 28.

As described above, the coil L2 preferably is in the form of a loop that runs from the connecting point of the via hole conductor b27 and the ground conductor layer 30 as one end, to the connecting point of the via hole conductor b33 and the capacitor conductor layer 28 as the other end, via the via hole conductors b21 to b27, the line conductor layers 18c and 18d, and the via hole conductors b28 to b33.

The LC parallel resonator LC2 configured as described above defines a loop plane that is parallel or substantially parallel to the yz-plane. The loop plane of the LC parallel resonator LC2 refers to a rectangular or substantially rectangular imaginary plane that is surrounded by the LC parallel resonator LC2.

As illustrated in FIG. 3, the LC parallel resonator LC3 includes a coil L3 and a capacitor C3. More specifically, the LC parallel resonator LC3 includes via hole conductors b51 to b65, line conductor layers 18e and 18f, capacitor conductor layers 26c and 32b, and the ground conductor layer 30, and is in the form of a loop.

The capacitor C3 includes the capacitor conductor layers 26c and 32b, and the ground conductor layer 30. The ground conductor layer 30 is a cross-shaped or substantially cross-shaped conductor layer.

The capacitor conductor layer 26c is a conductor layer that is opposite to the end portion 30c of the ground conductor layer 30 via the insulator layers 16g and 16h. The capacitor conductor layer 26c is provided on the front surface of the insulator layer 16g. Consequently, an electrostatic capacitance is generated between the capacitor conductor layer 26c and the ground conductor layer 30. The capacitor conductor layer 26c has a rectangular or substantially rectangular shape whose length is along the y-axis direction. The capacitor conductor layer 26c is provided on the positive direction side of the x-axis direction with respect to the intersection of the diagonals of the insulator layer 16g.

The capacitor conductor layer 32b is a conductor layer that is opposite to the end portion 30c of the ground conductor layer 30 via the insulator layer 16i. The capacitor conductor layer 32b is provided on the front surface of the insulator layer 16j. Consequently, an electrostatic capacitance is generated between the capacitor conductor layer 32b and the ground conductor layer 30. The capacitor conductor layer 32b has a rectangular or substantially rectangular shape whose length is along the y-axis direction. The capacitor conductor layer 32b is provided on the positive direction side of the x-axis direction with respect to the intersection of the diagonals of the insulator layer 16j. As the electrostatic capacitance between the capacitor conductor layer 26c and the ground conductor layer 30, and the electrostatic capacitance between the capacitor conductor layer 32b and the ground conductor layer 30 are connected substantially in parallel, the capacitor C3 is provided.

The coil L3 includes the via hole conductors b51 to b65 and the line conductor layers 18e and 18f. The line conductor layer 18e is provided on the front surface of the insulator layer 16b, and is a linear or substantially linear conductor having an L shape or a substantially L shape. More specifically, the line conductor layer 18e includes a parallel portion A and a bent portion B. The parallel portion A extends in the y-axis direction. The bent portion B extends from an end portion on the positive direction side of the y-axis direction of the parallel portion A to the negative direction side of the x-axis direction. The line conductor layer 18e configured as described above is provided on the positive direction side of the x-axis direction with respect to the intersection of the diagonals of the insulator layer 16b.

The line conductor layer 18f is provided on the front surface of the insulator layer 16c, and is a linear or substantially linear conductor having an L shape or a substantially L shape. More specifically, the line conductor layer 18f includes a parallel portion A and a bent portion B. The parallel portion A extends in the y-axis direction. The bent portion B extends from an end portion on the positive direction side of the y-axis direction of the parallel portion A to the negative direction side of the x-axis direction. The line conductor layer 18f configured as described above is provided on the positive direction side of the x-axis direction with respect to the intersection of the diagonals of the insulator layer 16c.

The via hole conductors b51 to b57 penetrate the insulator layers 16b to 16h, respectively, in the z-axis direction. An end portion on the positive direction side of the z-axis direction of the via hole conductor b51 is connected to an end portion on the negative direction side of the x-axis direction of the bent portion B of the line conductor layer 18e. An end portion on the positive direction side of the z-axis direction of the via hole conductor b52 is connected to an end portion on the negative direction side of the x-axis direction of the bent portion B of the line conductor layer 18f. An end portion on the negative direction side of the z-axis direction of the via hole conductor b57 is connected to the ground conductor layer 30. Consequently, the via hole conductors b51 to b57 define a single via hole conductor that extends from an end portion on the positive direction side of the y-axis direction of each of the line conductor layers 18e and 18f toward the negative direction side of the z-axis direction, and are connected to the ground conductor layer 30.

The via hole conductors b58 to b65 penetrate the insulator layers 16b to 16i, respectively, in the z-axis direction. The via hole conductors b58 to b65 are provided on the negative direction side of the y-axis direction with respect to the via hole conductors b51 to b57. An end portion on the positive direction side of the z-axis direction of the via hole conductor b58 is connected to an end portion on the negative direction side of the y-axis direction of the parallel portion A of the line conductor layer 18e. An end portion on the positive direction side of the z-axis direction of the via hole conductor b59 is connected to an end portion on the negative direction side of the y-axis direction of the parallel portion A of the line conductor layer 18f. An end portion on the negative direction side of the z-axis direction of the via hole conductor b62 is connected to the capacitor conductor layer 26c. In addition, an end portion on the negative direction side of the z-axis direction of the via hole conductor b65 is connected to the capacitor conductor layer 32b. Consequently, the via hole conductors b58 to b65 define a single via hole conductor that extends from an end portion on the negative direction side of the y-axis direction of each of the line conductor layers 18e and 18f toward the negative direction side of the z-axis direction, and are connected to the capacitor conductor layers 26c and 32b.

As described above, in the yz-plane, the coil L3 is in the form of a loop that runs from the connecting point of the via hole conductor b57 and the ground conductor layer 30 as one end, to the connecting point of the via hole conductor b65 and the capacitor conductor layer 32b as the other end, via the via hole conductors b51 to b57, the line conductor layers 18e and 18f, and the via hole conductors b58 to b65.

When seen in plan view from the z-axis direction, the LC parallel resonator LC3 configured as described above defines a loop plane that is bent in an L shape or a substantially L shape. The loop plane of the LC parallel resonator LC3 refers to an imaginary plane that is surrounded by the LC parallel resonator LC3.

The loop plane of the LC parallel resonator LC1 and the loop plane of the LC parallel resonator LC3 sandwich the loop plane of the LC parallel resonator LC2. Consequently, as illustrated in FIG. 3, the coil L1 of the LC parallel resonator LC1 and the coil L2 of the LC parallel resonator LC2 are electromagnetically coupled to each other. In addition, the coil L2 of the LC parallel resonator LC2 and the coil L3 of the LC parallel resonator LC3 are electromagnetically coupled to each other.

The line conductor layers 18a and 18e have an L shape or a substantially L shape. The via hole conductors b1 to b7 are connected to an end portion on the positive direction side of the y-axis direction of the line conductor layer 18a, and the via hole conductors b8 to b15 are connected to an end portion on the negative direction side of the y-axis direction of the line conductor layer 18a. Further, the via hole conductors b21 to b27 are connected to an end portion on the positive direction side of the y-axis direction of the line conductor layer 18c, and the via hole conductors b28 to b33 are connected to an end portion on the negative direction side of the y-axis direction of the line conductor layer 18c. Further, the via hole conductors b51 to b57 are connected to an end portion on the positive direction side of the y-axis direction of the line conductor layer 18e, and the via hole conductors b58 to b65 are connected to an end portion on the negative direction side of the y-axis direction of the line conductor layer 18e.

Consequently, the distance between the via hole conductors b1 to b7 and the via hole conductors b21 to b27 that are adjacent to each other in the y-axis direction differs from the distance between the via hole conductors b8 to b15 and the via hole conductors b28 to b33 that are adjacent to each other in the y-axis direction. In this preferred embodiment, the distance between the via hole conductors b8 to b15 and the via hole conductors b28 to b33 is larger than the distance between the via hole conductors b1 to b7 and the via hole conductors b21 to b27.

Likewise, the distance between the via hole conductors b51 to b57 and the via hole conductors b21 to b27 that are adjacent to each other in the y-axis direction differs from the distance between the via hole conductors b58 to b65 and the via hole conductors b28 to b33 that are adjacent to each other in the y-axis direction. In this preferred embodiment, the distance between the via hole conductors b58 to b65 and the via hole conductors b28 to b33 is larger than the distance between the via hole conductors b51 to b57 and the via hole conductors b21 to b27. The distance refers to the linear distance when seen in plan view from the z-axis direction.

When seen in plan view from the z-axis direction, the parallel portions A of the line conductor layers 18a to 18f extend in parallel or substantially in parallel to one another on the positive direction side of the y-axis direction, from the via hole conductors b8 to b15, b28 to b33, and b58 to b65 which are connected to the capacitor conductor layers 32a, 28, and 32b, respectively.

The capacitor C4 includes capacitor conductor layers 22a and 22b, and a coupling conductor layer 24a. The coupling conductor layer 24a is provided on the front surface of the insulator layer 16f, and extends in the x-axis direction. The capacitor conductor layer 22a is a conductor layer that is opposite to the coupling conductor layer 24a via the insulator layer 16e. The capacitor conductor layer 22a is provided on the front surface of the insulator layer 16e. The capacitor conductor layer 22a is connected to the via hole conductors b10 and b11. The capacitor conductor layer 22b is a conductor layer that is opposite to the coupling conductor layer 24a via the insulator layer 16e. The capacitor conductor layer 22b is provided on the front surface of the insulator layer 16e. The capacitor conductor layer 22b is connected to the via hole conductors b30 and b31. Consequently, an electrostatic capacitance is generated between each of the capacitor conductor layers 22a and 22b and the coupling conductor layer 24a, and the capacitor C4 is provided. As described above, the LC parallel resonator LC1 and the LC parallel resonator LC2 are capacitively coupled to each other via the capacitor C4.

The capacitor C5 includes the capacitor conductor layer 22b, a capacitor conductor layer 22c, and a coupling conductor layer 24b. The coupling conductor layer 24b is provided on the front surface of the insulator layer 16f, and extends in the x-axis direction. The capacitor conductor layer 22c is a conductor layer that is opposite to the coupling conductor layer 24b via the insulator layer 16e. The capacitor conductor layer 22c is provided on the front surface of the insulator layer 16e. The capacitor conductor layer 22c is connected to the via hole conductors b60 and b61. The capacitor conductor layer 22b is a conductor layer that is opposite to the coupling conductor layer 24b via the insulator layer 16e. The capacitor conductor layer 22b is provided on the front surface of the insulator layer 16e. Consequently, an electrostatic capacitance is generated between each of the capacitor conductor layers 22b and 22c and the coupling conductor layer 24b, and the capacitor C5 is provided. As described above, the LC parallel resonator LC3 and the LC parallel resonator LC2 are capacitively coupled to each other via the capacitor C5.

The capacitor C6 includes the capacitor conductor layers 22a and 22c, and a coupling conductor layer 20. The coupling conductor layer 20 is provided on the front surface of the insulator layer 16d, and extends in the x-axis direction. Consequently, the coupling conductor layer 20 is opposite to the capacitor conductor layers 22a and 22c via the insulator layer 16d. As a result, an electrostatic capacitance is generated between the capacitor conductor layer 22a and the coupling conductor layer 20, and an electrostatic capacitance is generated between the capacitor conductor layer 22b and the coupling conductor layer 20. As described above, the capacitor conductor layers 22a and 22c are capacitively coupled to each other via the coupling conductor layer 20. Consequently, the capacitor C6 is provided. In this way, the LC parallel resonator LC1 and the LC parallel resonator LC3 are capacitively coupled to each other via the capacitor C6.

As illustrated in FIG. 1, the outer electrode 14a is provided on the bottom surface on the negative direction side of the z-axis direction of the laminate 12. The outer electrode 14a is used as an input electrode. That is, the outer electrode 14a is provided on the back surface of the insulator layer 16k. The outer electrode 14b is provided on the bottom surface on the negative direction side of the z-axis direction of the laminate 12. The outer electrode 14b is used as a ground electrode. That is, the outer electrode 14b is provided on the back surface of the insulator layer 16k. The outer electrode 14c is provided on the bottom surface on the negative direction side of the z-axis direction of the laminate 12. The outer electrode 14c is used as an output electrode. That is, the outer electrode 14c is provided on the back surface of the insulator layer 16k. The outer electrodes 14a to 14c are arranged in this order from the negative direction side to the positive direction side of the x-axis direction.

The via hole conductors b16 and b17 penetrate the insulator layers 16j and 16k, respectively, in the z-axis direction, and connect the capacitor conductor layer 32a and the outer electrode 14a. The via hole conductors b66 and b67 penetrate the insulator layers 16j and 16k, respectively, in the z-axis direction, and connect the capacitor conductor layer 32b and the outer electrode 14c. The via hole conductors b34 to b36 penetrate the insulator layers 16i to 16k, respectively, in the z-axis direction, and connect the ground conductor layer 30 and the outer electrode 14b. The via hole conductors b37 to b39 penetrate the insulator layers 16i to 16k, respectively, in the z-axis direction, and connect the ground conductor layer 30 and the outer electrode 14b. The via hole conductors b40 to b42 penetrate the insulator layers 16i to 16k, respectively, in the z-axis direction, and connect the ground conductor layer 30 and the outer electrode 14b.

Next, an example of operation of the filter 10 will be described with reference to FIGS. 1 to 3. First, a high frequency signal Sig1 inputted from the outer electrode 14a flows through the LC parallel resonator LC1 as illustrated in FIG. 3.

The coil L1 and the coil L2 are electromagnetically coupled to each other. Therefore, when the high frequency signal Sig1 flows through the LC parallel resonator LC1, a high frequency signal Sig2 flows through the LC parallel resonator LC2 due to electromagnetic induction.

The coil L2 and the coil L3 are electromagnetically coupled to each other. Therefore, when the high frequency signal Sig2 flows through the LC parallel resonator LC2, a high frequency signal Sig3 flows through the LC parallel resonator LC3 due to electromagnetic induction. Consequently, the high frequency signal Sig3 is outputted from the outer electrode 14c.

The LC parallel resonators LC1 to LC3 have natural resonant frequencies that are determined by the coils L1 to L3 and the capacitors C1 to C3, respectively. The impedances of the LC parallel resonators LC1 to LC3 become high at these resonant frequencies. Consequently, the high frequency signal Sig3 of a predetermined frequency band determined by these resonant frequencies is outputted from the outer electrode 14c without flowing to the ground via the outer electrode 14b.

Next, a non-limiting example of a manufacturing method for the filter 10 will be described with reference to FIGS. 1 and 2.

First, ceramic green sheets that are to become the insulator layers 16a to 16k are prepared. Next, the via hole conductors b1 to b17, b21 to b42, and b51 to b67 are formed in the respective ceramic green sheets that are to become the insulator layers 16b to 16k. Specifically, via holes are formed in the ceramic green sheets that are to become the insulator layers 16b to 16k by irradiation with a laser beam. Next, the via holes thus formed are filled with a conductive paste of Ag, Pd, Cu, or Au, an alloy thereof, or the like by print coating or the like.

Next, the front surfaces of the ceramic green sheets that are to become the insulator layers 16b to 16j are coated with a conductive paste whose main component is Ag, Pd, Cu, or Au, an alloy thereof, or the like by screen printing, photolithography, or the like, thus forming the line conductor layers 18a to 18f, the coupling conductor layers 20, 24a, and 24b, the capacitor conductor layers 22a to 22c, 26a to 26c, 28, 32a, and 32b, and the ground conductor layer 30. The back surface of ceramic green sheet that is to become the insulator layer 16k is coated with a conductive paste whose main component is Ag, Pd, Cu, or Au, an alloy thereof, or the like by screen printing, photolithography, or the like, thus forming conductor electrodes that are to become the outer electrodes 14a to 14c. Filling of the via holes with a conductive paste may be performed at the time of forming the conductor electrodes, the line conductor layers 18a to 18f, the coupling conductor layers 20, 24a, and 24b, the capacitor conductor layers 22a to 22c, 26a to 26c, 28, 32a, and 32b, and the ground conductor layer 30.

Next, the ceramic green sheets are stacked. Specifically, the ceramic green sheet that is to become the insulator layer 16k is placed. Next, the ceramic green sheet that is to become the insulator layer 16j is placed on top of the ceramic green sheet that is to become the insulator layer 16k. Thereafter, the ceramic green sheet that is to become the insulator layer 16j is contact-bonded to the ceramic green sheet that is to become the insulator layer 16k. Thereafter, likewise, the ceramic green sheets that are to become the insulator layers 16i, 16h, 16g, 16f, 16e, 16d, 16c, 16b, and 16a are likewise stacked and contact-bonded to one another in this order. A mother laminate is formed through the above-mentioned steps. The mother laminate is subjected to the contact bonding by isostatic pressing or the like.

Next, the mother laminate is cut into the laminate 12 having predetermined dimensions with a cutting edge. The laminate 12 that has not been fired yet is subjected to binder removal treatment and firing.

A fired laminate 12 is obtained through the above-mentioned steps. The laminate 12 is barrel finished and chamfered.

Lastly, Ni plating/Sn plating is applied to the front surfaces of the conductor electrodes, thus forming the outer electrodes 14a to 14c. The filter 10 as illustrated in FIG. 1 is completed through the above-mentioned steps.

According to the filter 10 configured as described above, a desired transmission characteristic can be easily obtained. More specifically, in the filter 10, the distance between the via hole conductors b8 to b15 and the via hole conductors b28 to b33 is larger than the distance between the via hole conductors b1 to b7 and the via hole conductors b21 to b27. The distance between the via hole conductors b58 to b65 and the via hole conductors b28 to b33 is larger than the distance between the via hole conductors b51 to b57 and the via hole conductors b21 to b27. Consequently, in the filter 10, the via hole conductors b1 to b7, the via hole conductors b21 to b27, and the via hole conductors b51 to b57 which are connected to the ground conductor layer 30 are in closer proximity to one another than the via hole conductors b8 to b15, the via hole conductors b28 to b33, and the via hole conductors b58 to b65 respectively connected to the capacitor conductor layers 32a, 28, and 32b are to one another. When the via hole conductors connected to the ground conductor layer are in close proximity to one another, their magnetic field coupling becomes relatively strong, thus narrowing the pass band. When the via hole conductors connected to the capacitor conductor layers are in close proximity to one another, their capacitive coupling becomes relatively strong, thus narrowing the pass band. Therefore, narrowing of the pass band is achieved for the filter 10.

As described above, according to the filter 10, the distance between the via hole conductors b8 to b15 and the via hole conductors b28 to b33, and the distance between the via hole conductors b1 to b7 and the via hole conductors b21 to b27 are made to differ from each other, and the distance between the via hole conductors b58 to b65 and the via hole conductors b28 to b33, and the distance between the via hole conductors b51 to b57 and the via hole conductors b21 to b27 are made to differ from each other. Consequently, the pass band of the filter 10 can be made to vary. That is, a desired transmission characteristic can be easily obtained for the filter 10.

The pass band of the filter 10 can be made to vary also for the reason described below. More specifically, when seen in plan view from the z-axis direction, the parallel portions A of the line conductor layers 18a to 18f extend to the positive direction side of the y-axis direction in parallel or substantially in parallel to one another, from the via hole conductors b8 to b15, the via hole conductors b28 to b33, and the via hole conductors b58 to b65 which are connected to the capacitor conductor layers 32a, 28, and 32b. That is, the parallel portions A of the line conductor layers 18a, 18c, and 18e extend in parallel or substantially in parallel while being spaced apart from one another. Likewise, the parallel portions A of the line conductor layers 18b, 18d, and 18f extend in parallel or substantially in parallel while being spaced apart from one another. Consequently, the magnetic field coupling between the line conductor layers 18a, 18c, and 18e, and the magnetic field coupling between the line conductor layers 18b, 18d, and 18f become weak. As a result, the pass band of the filter 10 can be widened. In this way, the pass band of the filter 10 can be made to vary also by varying the shapes of the line conductor layers 18a to 18f. That is, a desired transmission characteristic can be easily obtained for the filter 10.

Figure 4:
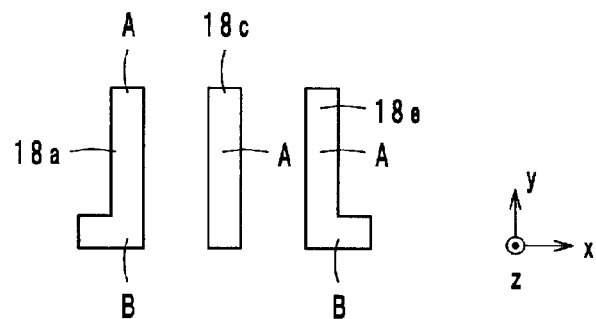
FIG. 4 is a plan view, as seen from the z-axis direction, of line conductor layers according to a first model.
Figure 5:
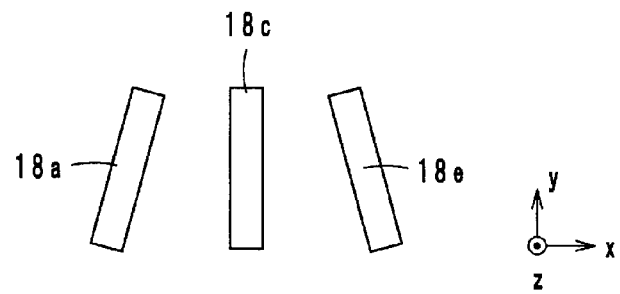
FIG. 5 is a plan view, as seen from the z-axis direction, of line conductor layers according to a second model.
Figure 6:
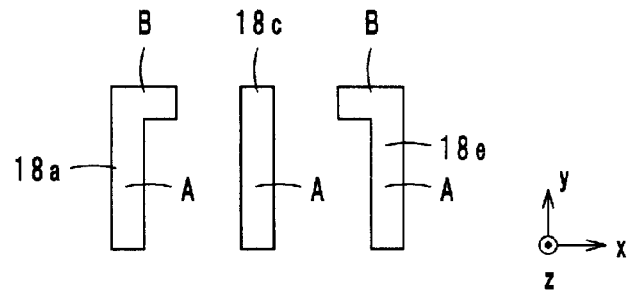
FIG. 6 is a plan view, as seen from the z-axis direction, of line conductor layers according to a third model.
Figure 7:
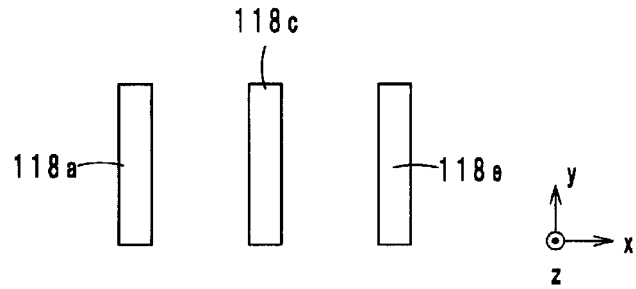
FIG. 7 is a plan view, as seen from the z-axis direction, of line conductor layers according to a fourth model.

In order to further clarify the effects of the filter 10, the present inventors conducted the computer simulation described below. More specifically, first to third models of the filter 10, and a fourth model of a filter according to a comparative example were prepared. FIG. 4 is a plan view, as seen from the z-axis direction, of the line conductor layers 18a, 18c, and 18e according to the first model. FIG. 5 is a plan view, as seen from the z-axis direction, of the line conductor layers 18a, 18c, and 18e according to the second model. FIG. 6 is a plan view, as seen from the z-axis direction, of the line conductor layers 18a, 18c, and 18e according to the third model. FIG. 7 is a plan view, as seen from the z-axis direction, of line conductor layers 118a, 118c, and 118e according to the fourth model.

In the first model, as illustrated in FIG. 4, the parallel portions A of the line conductor layers 18a, 18c, and 18e are in close proximity to one another. That is, when seen in plan view from the z-axis direction, the parallel portions A of the line conductor layers 18a, 18c, and 18e extend in parallel or substantially in parallel to one another to the negative direction side of the y-axis direction from the via hole conductors b1 to b7, the via hole conductors b21 to b27, and the via hole conductors b51 to b57 which are connected to the ground conductor layer 30. The bent portion B of the line conductor layer 18a extends to the negative direction side of the x-axis direction from an end portion on the negative direction side of the y-axis direction of the parallel portion A. The bent portion B of the line conductor layer 18e extends to the positive direction side of the x-axis direction from an end portion on the negative direction side of the y-axis direction of the parallel portion A.

In the second model, as illustrated in FIG. 5, when seen in plan view from the z-axis direction, the line conductor layers 18a, 18c, and 18e are in the shape of a straight line or substantially straight line, and their distance decreases with increasing proximity to the positive direction side of the y-axis direction.

In the third model, as illustrated in FIG. 6, the parallel portions A of the line conductor layers 18a, 18c, and 18e are spaced apart from one another. That is, when seen in plan view from the z-axis direction, the parallel portions A of the line conductor layers 18a, 18c, and 18e extend in parallel or substantially in parallel to one another to the positive direction side of the y-axis direction from the via hole conductors b8 to b15, the via hole conductors b28 to b33, and the via hole conductors b58 to b65 which are connected to the capacitor conductor layers 32a, 28, and 32b, respectively. The bent portion B of the line conductor layer 18a extends to the positive direction side of the x-axis direction from an end portion on the positive direction side of the y-axis direction of the parallel portion A. The bent portion B of the line conductor layer 18e extends to the negative direction side of the x-axis direction from an end portion on the positive direction side of the y-axis direction of the parallel portion A. The third model has the same structure as the filter 10 illustrated in FIG. 2.

In the fourth model, as illustrated in FIG. 7, the line conductor layers 118a, 118c, 118e are in the shape of a straight line or substantially straight line extending in the y-axis direction. That is, the line conductor layers 118a, 118c, 118e are parallel or substantially parallel to one another.

Figure 8:
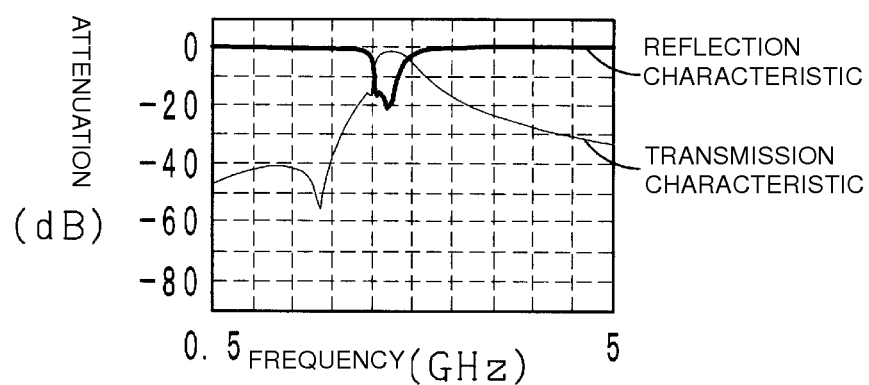
FIG. 8 is a graph illustrating simulation results for the first model.
Figure 9:
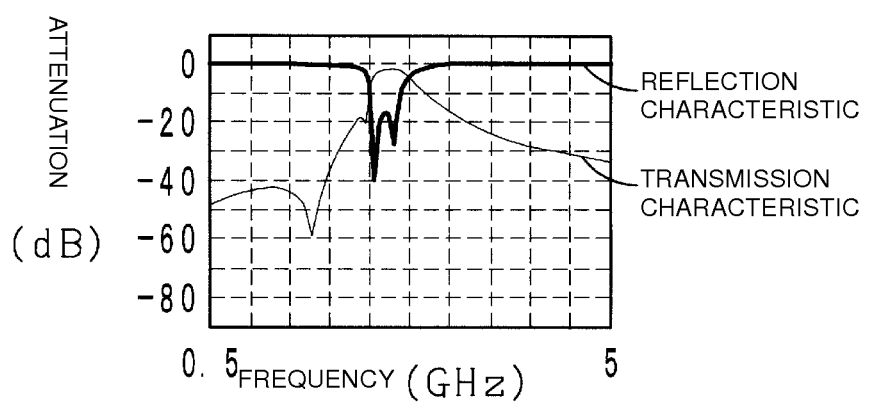
FIG. 9 is a graph illustrating simulation results for the second model.
Figure 10:
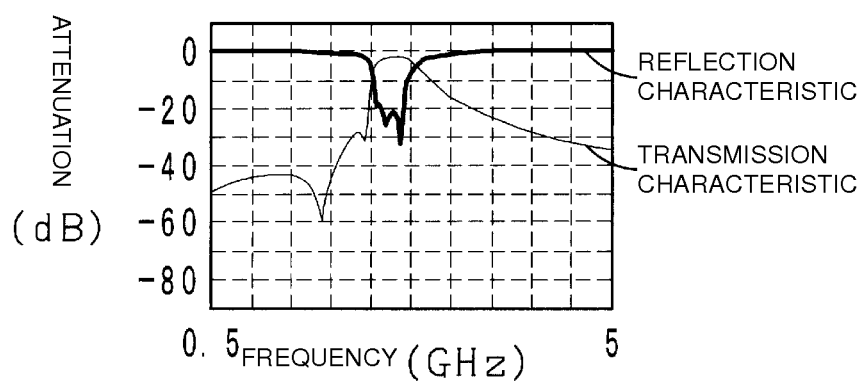
FIG. 10 is a graph illustrating simulation results for the third model.
Figure 11:
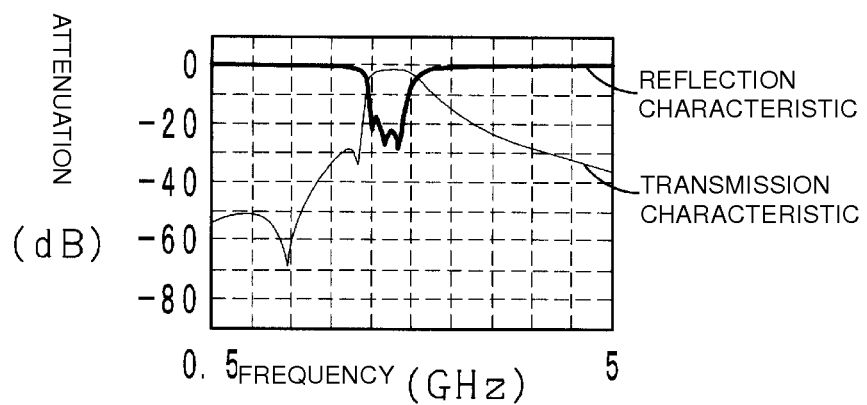
FIG. 11 is a graph illustrating simulation results for the fourth model.

The present inventors investigated the transmission characteristics and reflection characteristics of the first to fourth models. A transmission characteristic represents the relationship between the attenuation of an output signal outputted from the outer electrode 14c with respect to an input signal inputted from the outer electrode 14a, and the frequency of the input signal. A reflection characteristic represents the relationship between the attenuation of an output signal outputted from the outer electrode 14a with respect to an input signal inputted from the outer electrode 14a, and the frequency of the input signal. FIG. 8 is a graph illustrating simulation results for the first model. FIG. 9 is a graph illustrating simulation results for the second model. FIG. 10 is a graph illustrating simulation results for the third model. FIG. 11 is a graph illustrating simulation results for the fourth model. The vertical axis represents attenuation, and the horizontal axis represents frequency.

It is appreciated from a comparison between the graphs in FIGS. 8 to 10 and the graph in FIG. 11 that the pass bands of the first to third models are narrower than the pass band of the fourth model. Therefore, it is appreciated that the band of the filter 10 is narrowed because the via hole conductors b1 to b7, the via hole conductors b21 to b27, and the via hole conductors b51 to b57 which are connected to the ground conductor layer 30 are in closer proximity to one another than the via hole conductors b8 to b15, the via hole conductors b28 to b33, and the via hole conductors b58 to b65 respectively connected to the capacitor conductor layers 32a, 28, and 32b are to one another.

It is appreciated from a comparison between the graphs in FIGS. 8 to 10 that the pass band of the first model is the narrowest, and the pass band of the third model is the widest. It is appreciated that because the parallel portions A are in close proximity to one another in the first model, the magnetic field coupling between the LC parallel resonators LC1 to LC3 is strong, resulting in narrowing of the band in the first model. In contrast, it is appreciated that because the parallel portions A are spaced apart from one another in the third model, the magnetic field coupling between the LC parallel resonators LC1 to LC3 is weak, resulting in widening of the band in the third model. It is appreciated from the above discussion that the transmission characteristic of the filter 10 can be made to vary also by varying the shapes of the line conductor layers 18a to 18f.

Figure 12:
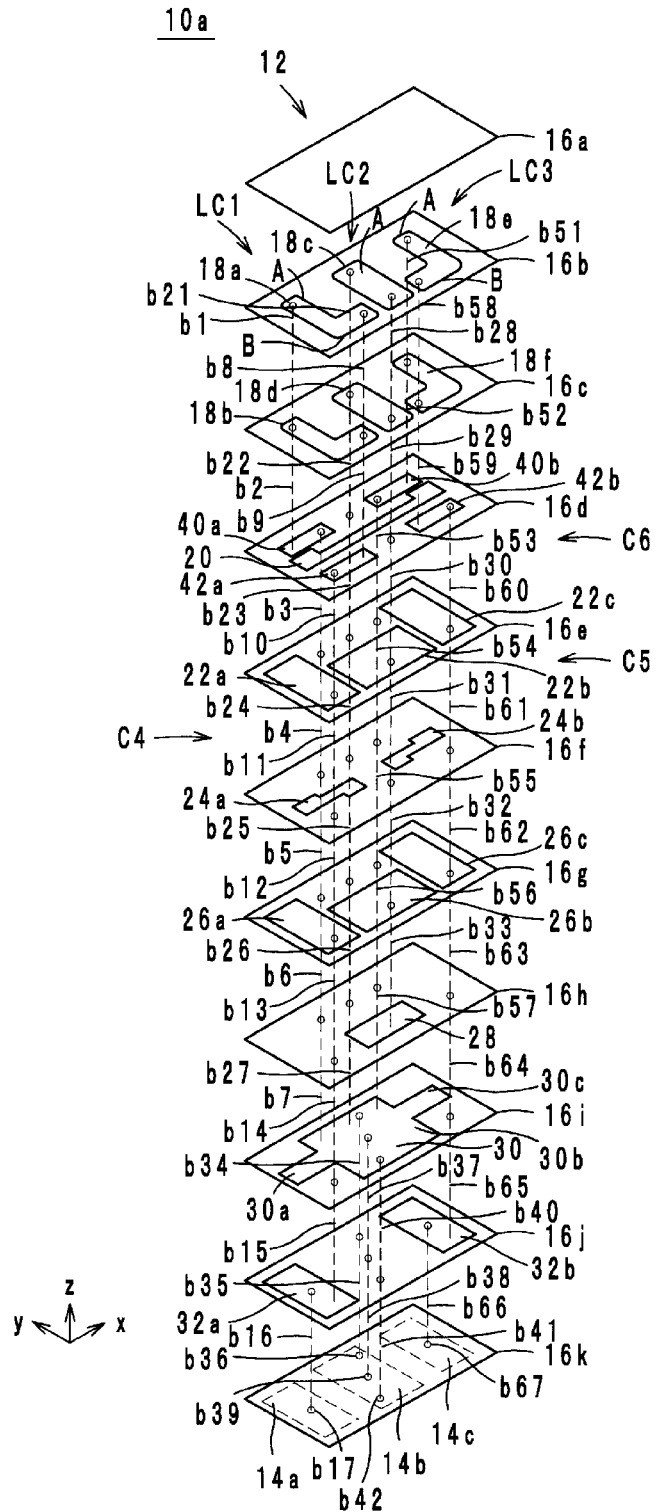
FIG. 12 is an exploded perspective view of the laminate of a filter according to a modification of a preferred embodiment of the present invention.

Hereinafter, a filter 10a according to a modification of a preferred embodiment of the present invention will be described with reference to the drawings. FIG. 12 is an exploded perspective view of the laminate 12 of the filter 10a according to the modification. In FIG. 12, the same components as those of the filter 10 are denoted by the same reference numerals used for the filter 10. As for the perspective view of the outward appearance of the filter 10a, FIG. 1 is used. As for the equivalent circuit diagram of the filter 10a, FIG. 3 is used.

The difference between the filter 10 and the filter 10a resides in that the via hole conductors b8 and b9, the via hole conductors b28 and b29, and the via hole conductors b58 and b59 electrically connected to the capacitor conductor layers 32a, 28, and 32b, respectively, are in closer proximity to one another than the via hole conductors b1 and b2, the via hole conductors b21 and b22, and the via hole conductors b51 and b52 electrically connected to the ground conductor layer 30 are to one another.

More specifically, as illustrated in FIG. 3, the LC parallel resonator LC1 includes the coil L1 and the capacitor C1. More specifically, the LC parallel resonator LC1 includes the via hole conductors b1 to b15, the line conductor layers 18a and 18b, the capacitor conductor layers 26a and 32a, the ground conductor layer 30, and connection conductor layers 40a and 42a, and is in the form of a loop.

Since the capacitor C1 of the filter 10a is the same as the capacitor C1 of the filter 10, a description of the capacitor C1 is omitted.

The coil L1 includes the via hole conductors b1 to b15, the line conductor layers 18a and 18b, and the connection conductor layers 40a and 42a. The line conductor layer 18a is provided on the front surface of the insulator layer 16b, and is a linear or substantially linear conductor having an L shape or a substantially L shape. More specifically, the line conductor layer 18a includes a parallel portion A and a bent portion B. The parallel portion A extends in the y-axis direction. The bent portion B extends from an end portion on the negative direction side of the y-axis direction of the parallel portion A to the positive direction side of the x-axis direction. The line conductor layer 18a configured as described above is provided on the negative direction side of the x-axis direction with respect to the intersection of the diagonals of the insulator layer 16b.

The line conductor layer 18b is provided on the front surface of the insulator layer 16c, and is a linear or substantially linear conductor having an L shape or a substantially L shape. More specifically, the line conductor layer 18b includes a parallel portion A and a bent portion B. The parallel portion A extends in the y-axis direction. The bent portion B extends from an end portion on the negative direction side of the y-axis direction of the parallel portion A to the positive direction side of the x-axis direction. The line conductor layer 18b configured as described above is provided on the negative direction side of the x-axis direction with respect to the intersection of the diagonals of the insulator layer 16c.

The connection conductor layer 40a is provided on the front surface of the insulator layer 16d, and extends in the x-axis direction. The connection conductor layer 40a is provided on the negative direction side of the x-axis direction and on the positive direction side of the y-axis direction, with respect to the intersection of the diagonals of the insulator layer 16d. The connection conductor layer 42a is provided on the front surface of the insulator layer 16d, and extends in the x-axis direction. The connection conductor layer 42a is provided on the negative direction side of the x-axis direction and on the negative direction side of the y-axis direction, with respect to the intersection of the diagonals of the insulator layer 16d.

The via hole conductors b1 and b2 penetrate the insulator layers 16b and 16c, respectively, in the z-axis direction. An end portion on the positive direction side of the z-axis direction of the via hole conductor b1 is connected to an end portion on the positive direction side of the y-axis direction of the parallel portion A of the line conductor layer 18a. An end portion on the positive direction side of the z-axis direction of the via hole conductor b2 is connected to an end portion on the positive direction side of the y-axis direction of the parallel portion A of the line conductor layer 18b. In addition, an end portion on the negative direction side of the z-axis direction of the via hole conductor b2 is connected to an end portion on the negative direction side of the x-axis direction of the connection conductor layer 40a.

The via hole conductors b3 to b7 penetrate the insulator layers 16d to 16h, respectively, in the z-axis direction. An end portion on the positive direction side of the z-axis direction of the via hole conductor b3 is connected to an end portion on the positive direction side of the x-axis direction of the connection conductor layer 40a. An end portion on the negative direction side of the z-axis direction of the via hole conductor b7 is connected to the ground conductor layer 30. Consequently, the via hole conductors b1 and b2 define a single via hole conductor that extends from an end portion on the positive direction side of the y-axis direction of each of the line conductor layers 18a and 18b toward the negative direction side of the z-axis direction. In addition, the via hole conductors b1 and b2 are electrically connected to the ground conductor layer 30 via the via hole conductors b3 to b7.

The via hole conductors b8 and b9 penetrate the insulator layers 16b and 16c, respectively, in the z-axis direction. An end portion on the positive direction side of the z-axis direction of the via hole conductor b8 is connected to an end portion on the positive direction side of the x-axis direction of the bent portion B of the line conductor layer 18a. An end portion on the positive direction side of the z-axis direction of the via hole conductor b9 is connected to an end portion on the positive direction side of the x-axis direction of the bent portion B of the line conductor layer 18b. In addition, an end portion on the negative direction side of the z-axis direction of the via hole conductor b9 is connected to an end portion on the positive direction side of the x-axis direction of the connection conductor layer 42a.

The via hole conductors b10 to b15 penetrate the insulator layers 16d to 16i, respectively, in the z-axis direction. An end portion on the positive direction side of the z-axis direction of the via hole conductor b10 is connected to an end portion on the negative direction side of the x-axis direction of the connection conductor layer 42a. An end portion on the negative direction side of the z-axis direction of the via hole conductor b12 is connected to the capacitor conductor layer 26a. In addition, an end portion on the negative direction side of the z-axis direction of the via hole conductor b15 is connected to the capacitor conductor layer 32a. Consequently, the via hole conductors b8 and b9 define a single via hole conductor that extends from an end portion on the negative direction side of the y-axis direction of each of the line conductor layers 18a and 18b toward the negative direction side of the z-axis direction. In addition, the via hole conductors b8 and b9 are connected to the capacitor conductor layers 26a and 32a, respectively, via the via hole conductors b10 to b15.

Since the LC parallel resonator LC2 of the filter 10a is the same as the LC parallel resonator LC2 of the filter 10, a description of the LC parallel resonator LC2 is omitted.

As illustrated in FIG. 3, the LC parallel resonator LC3 includes the coil L3 and the capacitor C3. More specifically, the LC parallel resonator LC3 includes the via hole conductors b51 to b65, the line conductor layers 18e and 18f, the capacitor conductor layers 26c and 32b, the ground conductor layer 30, and connection conductor layers 40b and 42b, and is in the form of a loop.

Since the capacitor C3 of the filter 10a is the same as the capacitor C3 of the filter 10, a description of the capacitor C3 is omitted.

The coil L3 includes the via hole conductors b51 to b65, the line conductor layers 18e and 18f, and the connection conductor layers 40b and 42b. The line conductor layer 18e is provided on the front surface of the insulator layer 16b, and is a linear or substantially linear conductor having an L shape or a substantially L shape. More specifically, the line conductor layer 18e includes a parallel portion A and a bent portion B.

The parallel portion A extends in the y-axis direction. The bent portion B extends from an end portion on the negative direction side of the y-axis direction of the parallel portion A to the negative direction side of the x-axis direction. The line conductor layer 18e configured as described above is provided on the positive direction side of the x-axis direction with respect to the intersection of the diagonals of the insulator layer 16b.

The line conductor layer 18f is provided on the front surface of the insulator layer 16c, and is a linear or substantially linear conductor having an L shape or a substantially L shape. More specifically, the line conductor layer 18f includes a parallel portion A and a bent portion B. The parallel portion A extends in the y-axis direction. The bent portion B extends from an end portion on the negative direction side of the y-axis direction of the parallel portion A to the negative direction side of the x-axis direction. The line conductor layer 18f configured as described above is provided on the positive direction side of the x-axis direction with respect to the intersection of the diagonals of the insulator layer 16c.

The connection conductor layer 40b is provided on the front surface of the insulator layer 16d, and extends in the x-axis direction. The connection conductor layer 40b is provided on the positive direction side of the x-axis direction and on the positive direction side of the y-axis direction, with respect to the intersection of the diagonals of the insulator layer 16d. The connection conductor layer 42b is provided on the front surface of the insulator layer 16d, and extends in the x-axis direction. The connection conductor layer 42b is provided on the positive direction side of the x-axis direction and on the negative direction side of the y-axis direction, with respect to the intersection of the diagonals of the insulator layer 16d.

The via hole conductors b51 and b52 penetrate the insulator layers 16b and 16c, respectively, in the z-axis direction. An end portion on the positive direction side of the z-axis direction of the via hole conductor b51 is connected to an end portion on the positive direction side of the y-axis direction of the parallel portion A of the line conductor layer 18e. An end portion on the positive direction side of the z-axis direction of the via hole conductor b52 is connected to an end portion on the positive direction side of the y-axis direction of the parallel portion A of the line conductor layer 18f. In addition, an end portion on the negative direction side of the z-axis direction of the via hole conductor b52 is connected to an end portion on the positive direction side of the x-axis direction of the connection conductor layer 40b.

The via hole conductors b53 to b57 penetrate the insulator layers 16d to 16h, respectively, in the z-axis direction. An end portion on the positive direction side of the z-axis direction of the via hole conductor b53 is connected to an end portion on the negative direction side of the x-axis direction of the connection conductor layer 40b. An end portion on the negative direction side of the z-axis direction of the via hole conductor b57 is connected to the ground conductor layer 30. Consequently, the via hole conductors b51 and b52 define a single via hole conductor that extends from an end portion on the positive direction side of the y-axis direction of each of the line conductor layers 18e and 18f toward the negative direction side of the z-axis direction. In addition, the via hole conductors b51 and b52 are electrically connected to the ground conductor layer 30 via the via hole conductors b53 to b57.

The via hole conductors b58 and b59 penetrate the insulator layers 16b and 16c, respectively, in the z-axis direction. An end portion on the positive direction side of the z-axis direction of the via hole conductor b58 is connected to an end portion on the negative direction side of the x-axis direction of the bent portion B of the line conductor layer 18e. An end portion on the positive direction side of the z-axis direction of the via hole conductor b59 is connected to an end portion on the negative direction side of the x-axis direction of the bent portion B of the line conductor layer 18f. In addition, an end portion on the negative direction side of the z-axis direction of the via hole conductor b59 is connected to an end portion on the negative direction side of the x-axis direction of the connection conductor layer 42b.

The via hole conductors b60 to b65 penetrate the insulator layers 16d to 16i, respectively, in the z-axis direction. An end portion on the positive direction side of the z-axis direction of the via hole conductor b60 is connected to an end portion on the positive direction side of the x-axis direction of the connection conductor layer 42b. An end portion on the negative direction side of the z-axis direction of the via hole conductor b62 is connected to the capacitor conductor layer 26c. In addition, an end portion on the negative direction side of the z-axis direction of the via hole conductor b65 is connected to the capacitor conductor layer 32b. Consequently, the via hole conductors b58 and b59 define a single via hole conductor that extends from an end portion on the negative direction side of the y-axis direction of each of the line conductor layers 18e and 18f toward the negative direction side of the z-axis direction. In addition, the via hole conductors b58 and b59 are connected to the capacitor conductor layers 26c and 32b, respectively, via the via hole conductors b60 to b65.

Since the capacitors C4 to C6 of the filter 10a are the same as the capacitors C4 to C6 of the filter 10, a description of the capacitors C4 to C6 is omitted.

According to the filter 10a configured as described above, a desired transmission characteristic can be easily obtained. More specifically, in the filter 10a, the distance between the via hole conductors b8 and b9 and the via hole conductors b28 and b29 is smaller than the distance between the via hole conductors b1 and b2 and the via hole conductors b21 and b22. The distance between the via hole conductors b58 and b59 and the via hole conductors b28 and b29 is smaller than the distance between the via hole conductors b51 and b52 and the via hole conductors b21 and b22. Consequently, in the filter 10a, the via hole conductors b1 and b2, the via hole conductors b21 and b22, and the via hole conductors b51 and b52 which are electrically connected to the ground conductor layer 30 are in closer proximity to one another than the via hole conductors b8 and b9, the via hole conductors b28 and b29, and the via hole conductors b58 and b59 respectively connected to the capacitor conductor layers 32a, 28, and 32b are to one another. When the via hole conductors connected to the ground conductor layer are in close proximity to one another, their magnetic field coupling becomes relatively strong, thus narrowing the pass band. When the via hole conductors connected to the capacitor conductor layers are in close proximity to one another, their capacitive coupling becomes relatively strong, thus narrowing the pass band. Therefore, narrowing of the pass band is achieved for the filter 10a.

As described above, according to the filter 10a, the distance between the via hole conductors b8 and b9 and the via hole conductors b28 and b29, and the distance between the via hole conductors b1 and b2 and the via hole conductors b21 and b22 are made to differ from each other. In addition, the distance between the via hole conductors b58 and b59 and the via hole conductors b28 and b29, and the distance between the via hole conductors b51 and b52 and the via hole conductors b21 and b22 are made to differ from each other. Consequently, the pass band of the filter 10a can be made to vary. That is, a desired transmission characteristic can be easily obtained for the filter 10a.

The pass band of the filter 10a can be made to vary also for the reason described below. More specifically, when seen in plan view from the z-axis direction, the parallel portions A of the line conductor layers 18a to 18f extend to the negative direction side of the y-axis direction in parallel or substantially in parallel to one another, from the via hole conductors b1 and b2, the via hole conductors b21 and b22, and the via hole conductors b51 and b52 which are electrically connected to the ground conductor layer 30. That is, the parallel portions A of the line conductor layers 18a, 18c, and 18e extend in parallel or substantially in parallel while being spaced apart from one another. Likewise, the parallel portions A of the line conductor layers 18b, 18d, and 18f extend in parallel or substantially in parallel while being spaced apart from one another. Consequently, the magnetic field coupling between the line conductor layers 18a, 18c, and 18e, and the magnetic field coupling between the line conductor layers 18b, 18d, and 18f become weak. As a result, the pass band of the filter 10a can be widened. In this way, the pass band of the filter 10a can be made to vary also by varying the shapes of the line conductor layers 18a to 18f. That is, a desired transmission characteristic can be easily obtained for the filter 10a.

Figure 13:
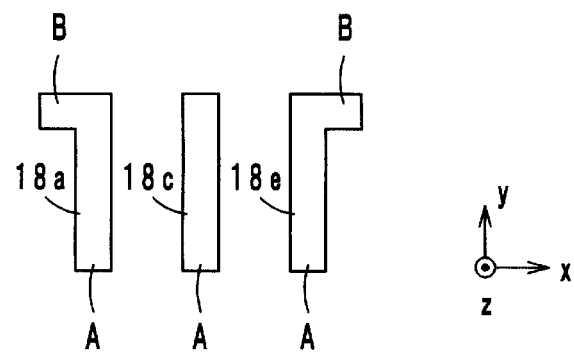
FIG. 13 is a plan view, as seen from the z-axis direction, of line conductor layers according to a fifth model.
Figure 14:
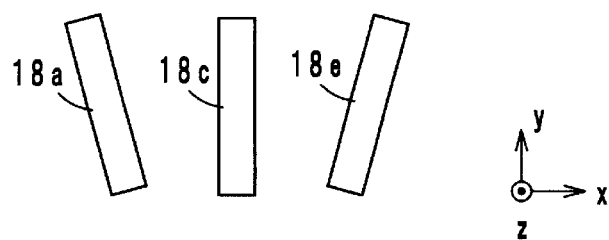
FIG. 14 is a plan view, as seen from the z-axis direction, of line conductor layers according to a sixth model.
Figure 15:
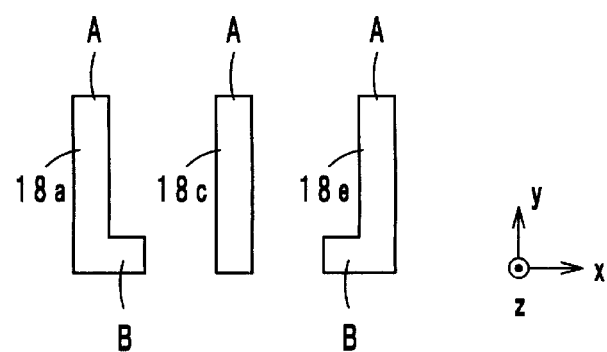
FIG. 15 is a plan view, as seen from the z-axis direction, of line conductor layers according to a seventh model.

In order to further clarify the effects of the filter 10a, the present inventors conducted the computer simulation described below. More specifically, fifth to seventh models of the filter 10a were prepared. FIG. 13 is a plan view, as seen from the z-axis direction, of the line conductor layers 18a, 18c, and 18e according to the fifth model. FIG. 14 is a plan view, as seen from the z-axis direction, of the line conductor layers 18a, 18c, and 18e according to the sixth model. FIG. 15 is a plan view, as seen from the z-axis direction, of the line conductor layers 18a, 18c, and 18e according to the seventh model.

In the fifth model, as illustrated in FIG. 13, the parallel portions A of the line conductor layers 18a, 18c, and 18e are in close proximity to one another. That is, when seen in plan view from the z-axis direction, the parallel portions A of the line conductor layers 18a, 18c, and 18e extend in parallel or substantially in parallel to one another to the positive direction side of the y-axis direction, from the via hole conductors b8 and b9, the via hole conductors b28 and b29, and the via hole conductors b58 and b59 which are electrically connected to the capacitor conductor layers 32a, 28, and 32b, respectively. The bent portion B of the line conductor layer 18a extends to the negative direction side of the x-axis direction from an end portion on the positive direction side of the y-axis direction of the parallel portion A. The bent portion B of the line conductor layer 18e extends to the positive direction side of the x-axis direction from an end portion on the positive direction side of the y-axis direction of the parallel portion A.

In the sixth model, as illustrated in FIG. 14, when seen in plan view from the z-axis direction, the line conductor layers 18a, 18c, and 18e are in the shape of a straight or a substantially straight line, and their distance increases with increasing proximity to the positive direction side of the y-axis direction.

In the seventh model, as illustrated in FIG. 15, the parallel portions A of the line conductor layers 18a, 18c, and 18e are spaced apart from one another. That is, when seen in plan view from the z-axis direction, the parallel portions A of the line conductor layers 18a, 18c, and 18e extend in parallel or substantially in parallel to one another to the negative direction side of the y-axis direction from the via hole conductors b1 and b2, the via hole conductors b21 and b22, and the via hole conductors b51 and b52 which are electrically connected to the ground conductor layer 30. The bent portion B of the line conductor layer 18a extends to the positive direction side of the x-axis direction from an end portion on the negative direction side of the y-axis direction of the parallel portion A. The bent portion B of the line conductor layer 18e extends to the negative direction side of the x-axis direction from an end portion on the negative direction side of the y-axis direction of the parallel portion A. The seventh model has the same structure as the filter 10a illustrated in FIG. 12.

Figure 16:
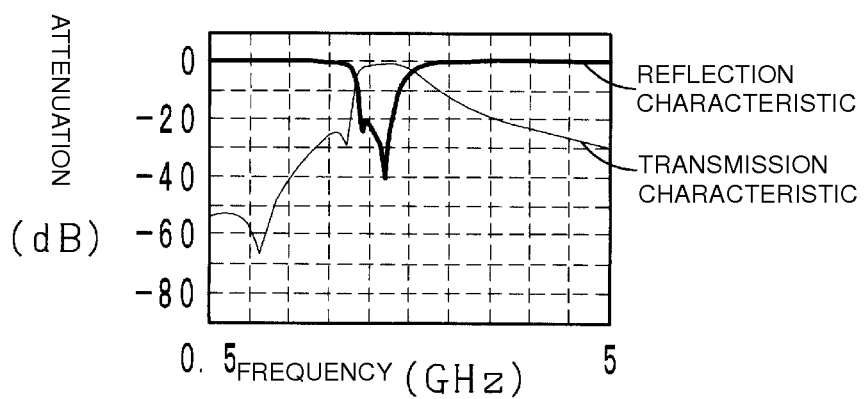
FIG. 16 is a graph illustrating simulation results for the fifth model.
Figure 17:
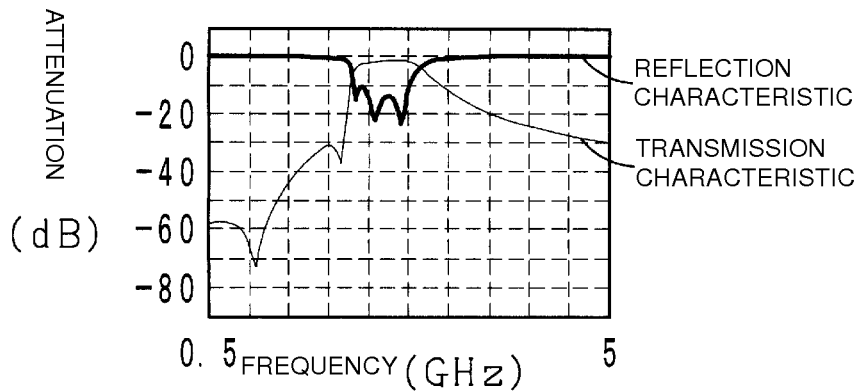
FIG. 17 is a graph illustrating simulation results for the sixth model.
Figure 18:
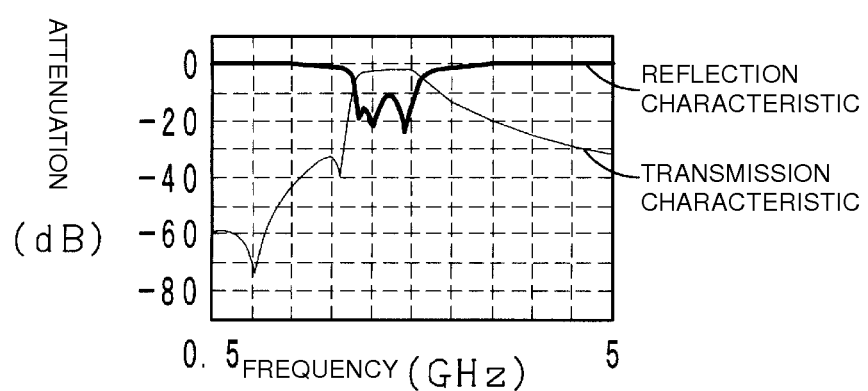
FIG. 18 is a graph illustrating simulation results for the seventh model.
Figure 19:
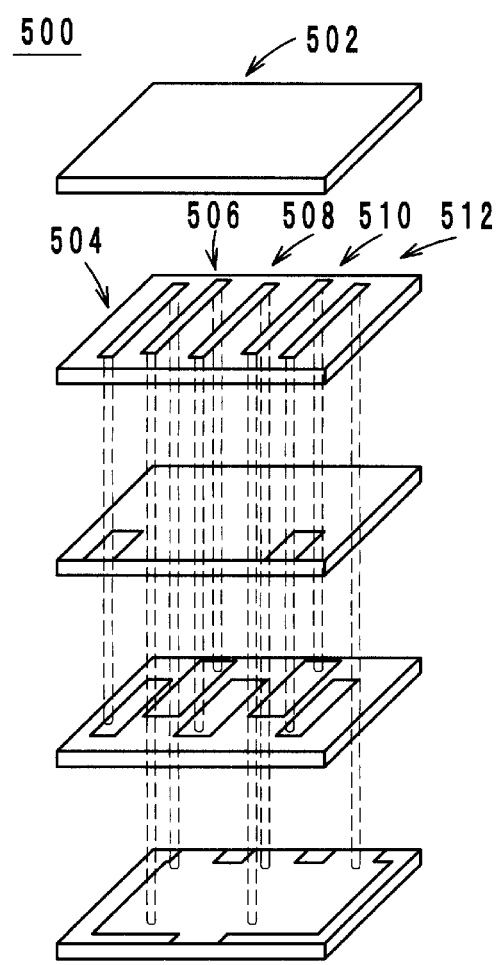
FIG. 19 is an exploded perspective view of a multilayer band pass filter described in International Publication No. 2007/119356.

The present inventors investigated the transmission characteristics and reflection characteristics of the fifth to seventh models. FIG. 16 is a graph illustrating simulation results for the fifth model. FIG. 17 is a graph illustrating simulation results for the sixth model. FIG. 18 is a graph illustrating simulation results for the seventh model. The vertical axis represents attenuation, and the horizontal axis represents frequency.

It is appreciated from a comparison between the graphs in FIGS. 16 to 18 and the graph in FIG. 11 that the pass bands of the fifth to seventh models are wider than the pass band of the fourth model. Therefore, it is appreciated that the band of the filter 10a is widened because the via hole conductors b8 and b9, the via hole conductors b28 and b29, and the via hole conductors b58 and b59 which are electrically connected to the capacitor conductor layers 32a, 28, and 32b, respectively, are in closer proximity to one another than the via hole conductors b1 to b2, the via hole conductors b21 and b22, and the via hole conductors b51 and b52 which are electrically connected to the ground conductor layer 30 are to one another.

It is appreciated from a comparison between the graphs in FIGS. 16 to 18 that the pass band of the fifth model is the narrowest, and the pass band of the seventh model is the widest. It is appreciated that because the parallel portions A are in close proximity to one another in the fifth model, the magnetic field coupling between the LC parallel resonators LC1 to LC3 is strong, resulting in narrowing of the band in the fifth model. In contrast, it is appreciated that because the parallel portions A are spaced apart from one another in the seventh model, the magnetic field coupling between the LC parallel resonators LC1 to LC3 is weak, resulting in widening of the band in the seventh model. It is appreciated from the above discussion that the transmission characteristic of the filter 10a can be made to vary also by varying the shapes of the line conductor layers 18a to 18f.

The filter according to the present invention is not limited to the filter 10 or 10a but can be modified in various ways within the scope of the present invention.

The number of LC parallel resonators may be two, or may be four or more, for example.

Preferred embodiments of the present invention are useful for a filter. In particular, the present invention proves advantageous in that a desired transmission characteristic can be easily obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A filter comprising:
 a laminate that includes a plurality of insulator layers that are laminated together; and
 a plurality of LC parallel resonators that are arranged along a first direction orthogonal or substantially orthogonal to a laminating direction in the laminate, the plurality of LC parallel resonators each including a coil and a capacitor; wherein respective LC parallel resonators of the plurality of LC parallel resonators that are adjacent to each other in the first direction are electromagnetically coupled to each other;

each of the capacitors includes:
- a capacitor conductor layer; and
- a ground conductor layer that is opposite to the respective capacitor conductor layer via a respective insulator layer of the plurality of insulator layers;

each of the coils includes:
- a line conductor layer that is provided on a respective insulator layer of the plurality of insulator layers;
- a first via hole conductor that extends from one end of the respective line conductor layer to one side of the laminating direction, the first via hole conductor being electrically connected to the respective capacitor conductor layer; and
- a second via hole conductor that extends from another end of the respective line conductor layer to the one side of the laminating direction, the second via hole conductor being electrically connected to the respective ground conductor layer; and the one end of the respective line conductor layer and the another end of the respective line conductor layer are spaced apart from each other in a second direction that is orthogonal or substantially orthogonal to the laminating direction;

a first distance between the respective first via hole conductors that are adjacent to each other in the first direction differs from a respective second distance between the second via hole conductors that are adjacent to each other in the first direction;

the first distance is smaller than the second distance; and at least one of the line conductor layers is a linear or substantially linear conductor that is L-shaped or substantially L-shaped.

2. The filter according to claim 1, wherein the plurality of LC parallel resonators includes four or more LC parallel resonators.

3. The filter according to claim 1, wherein the plurality of LC parallel resonators includes two LC parallel resonators.

4. The filter according to claim 1, wherein each of at least two of the line conductor layers including the at least one of the line conductor layers includes a bent portion and respective parallel portions, and the parallel portions of the corresponding at least two line conductor layers extend in parallel or substantially in parallel to one another and are spaced apart from each other.

5. The filter according to claim 1, wherein each of the coils is in the form of a loop.

6. The filter according to claim 1, wherein the at least one of the line conductor layers includes a bent portion and a parallel portion.

7. The filter according to claim 1, wherein at least one of the ground conductor layers is cross-shaped or substantially cross-shaped and at least one of the capacitor conductor layers is rectangular or substantially rectangular.

8. The filter according to claim 1, wherein each of the line conductor layers includes a respective parallel portion, the parallel portions of the corresponding line conductor layers extending in parallel or substantially in parallel to each other from the second via hole conductors when seen in a plan view from the laminating direction.

9. The filter according to claim 1, wherein each of the line conductor layers includes a respective parallel portion, the parallel portions of the corresponding line conductor layers extending in parallel or substantially in parallel to each other from the first via hole conductors when seen in a plan view from the laminating direction.

10. The filter according to claim 1, wherein the plurality of LC resonators are in the form of a loop.

11. The filter according to claim 1, wherein the plurality of LC parallel resonators includes three LC parallel resonators.

\* \* \* \* \*